US009431274B2

(12) United States Patent
Ramalingam et al.

(10) Patent No.: US 9,431,274 B2
(45) Date of Patent: Aug. 30, 2016

(54) METHOD FOR REDUCING UNDERFILL FILLER SETTLING IN INTEGRATED CIRCUIT PACKAGES

(71) Applicant: Intel Corporation, Santa Clara, CA (US)

(72) Inventors: Suriyakala Ramalingam, Chandler, AZ (US); Manish Dubey, Chandler, AZ (US); Hsin-Yu Li, Chandler, AZ (US); Michelle S. Phen, Chandler, AZ (US); Hitesh Arora, Chandler, AZ (US); Nisha Ananthakrishnan, Chandler, AZ (US); Yiqun Bai, Chandler, AZ (US); Yonghao Xiu, Chandler, AZ (US); Rajendra C. Dias, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 588 days.

(21) Appl. No.: 13/722,886

(22) Filed: Dec. 20, 2012

(65) Prior Publication Data

US 2014/0177149 A1 Jun. 26, 2014

(51) Int. Cl.
| | |
|---|---|
| *H01L 21/31* | (2006.01) |
| *H01L 21/56* | (2006.01) |
| *H01L 23/00* | (2006.01) |
| *H01L 23/29* | (2006.01) |

(52) U.S. Cl.
CPC ............ *H01L 21/563* (2013.01); *H01L 23/295* (2013.01); *H01L 24/29* (2013.01); *H01L 2224/16225* (2013.01); *H01L 2224/29386* (2013.01); *H01L 2224/29499* (2013.01); *H01L 2224/32225* (2013.01); *H01L 2224/73204* (2013.01); *H01L 2924/12042* (2013.01); *H01L 2924/15311* (2013.01); *H01L 2924/181* (2013.01)

(58) Field of Classification Search
CPC ......... C08K 3/00; C08L 63/00; H01L 23/10; H01L 23/14; H01L 23/24; H01L 21/563; H01L 23/295; H01L 24/29; H01L 2224/16225; H01L 2224/29386; H01L 2224/29499; H01L 2224/32225; H01L 2224/73204; H01L 2924/00; H01L 2924/181; H01L 2924/12042; H01L 2924/15311
See application file for complete search history.

(56) References Cited

U.S. PATENT DOCUMENTS

| | | | | | |
|---|---|---|---|---|---|
| 5,567,749 | A | * | 10/1996 | Sawamura | ........... C08G 59/245 257/E23.119 |
| 5,688,862 | A | * | 11/1997 | Kondou | ................... H01B 1/24 252/506 |
| 6,372,351 | B1 | * | 4/2002 | Takemiya | ................ C08K 3/04 257/E23.119 |
| 6,545,081 | B1 | * | 4/2003 | Nishihata | ................ C08K 3/04 428/412 |

(Continued)

*Primary Examiner* — Carl Arbes
(74) *Attorney, Agent, or Firm* — Schwabe, Williamson & Wyatt, P.C.

(57) ABSTRACT

Embodiments of the present disclosure are directed to techniques and configurations for an integrated circuit (IC) package having an underfill layer with filler particles arranged in a generally random distribution pattern. In some embodiments, a generally random distribution pattern of filler particles may be obtained by reducing an electrostatic charge on one or more components of the IC package assembly, by applying a surface treatment to filler to reduce filler electrical charge, by applying an electric force against the filler particles of the underfill material in a direction opposite to a direction of gravitational force, by using an underfill material with a relatively low maximum filler particle size, and/or by snap curing the underfill layer at a relatively low temperature. Other embodiments may be described and/or claimed.

7 Claims, 6 Drawing Sheets

(56) References Cited

U.S. PATENT DOCUMENTS

| | | | |
|---|---|---|---|
| 8,183,873 B2* | 5/2012 | Kobayashi | G06K 9/00053 324/658 |
| 2007/0132083 A1* | 6/2007 | Ito | H01L 23/60 257/686 |
| 2008/0242768 A1* | 10/2008 | Nishihata | C08L 63/00 523/468 |
| 2010/0097080 A1* | 4/2010 | Kobayashi | G06K 9/00053 324/692 |
| 2010/0170710 A1* | 7/2010 | Sasaki | H05K 9/0096 174/388 |
| 2012/0089180 A1* | 4/2012 | Fathi | B41J 2/17559 606/214 |
| 2014/0177149 A1* | 6/2014 | Ramalingam | H01L 24/29 361/679.02 |

* cited by examiner

METHOD FOR REDUCING UNDERFILL FILLER SETTLING IN INTEGRATED CIRCUIT PACKAGES

FIELD

Embodiments of the present disclosure generally relate to the field of integrated circuits, and more particularly, to techniques and configurations for uniform underfill particle distribution in an integrated circuit package.

BACKGROUND

An integrated circuit (IC) package assembly may include one or more dies coupled with a package substrate by interconnect structures. An underfill material may be deposited between one or more of the dies and the package substrate. The underfill provides stability and mechanical strength to the package by reducing a Coefficient of Thermal Expansion (CTE) mismatch between the die(s) and the package substrate and interconnects, and by providing structural support to the package.

Emerging underfill materials may include filler particles that are configured to further mitigate the effects of the CTE mismatch. However, the filler particles may settle away from a surface of the dies during flow and/or curing of the underfill material resulting in a non-uniform distribution of the filler particles between the dies and the package substrate. For example, the filler particles may settle away from bond Cu pads formed on the die such that the effects of CTE mismatch are not mitigated in these regions.

As a result, such filler settling may result in reliability failure associated with CTE mismatch such as, for example, delamination around the interconnect structures, which may further result in the formation of a crack in the underfill material. The crack may extend to the IC of the dies, which may lead to failure of the IC package. As the bump pitch scaling goes down, the risk of UF/Cu bump delamination and UF cracking caused by the filler settling increases.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 3-6 schematically illustrate an IC package assembly or components thereof during or subsequent to various fabrication operations.

DETAILED DESCRIPTION

Embodiments of the present disclosure describe techniques and configurations for uniform underfill particle distribution in an integrated circuit (IC) package. In some embodiments, an IC package may include an underfill layer and one or more interconnect structures disposed between a first IC substrate (e.g., a die) and a second IC substrate. In some embodiments, the one or more interconnect structures may include a first bond pad coupled with the first IC substrate, a second bond pad coupled with the second IC substrate, and a conductive element (e.g., solder) coupled with the first and second bond pads. The underfill layer may surround the one or more interconnect structures or some portion thereof (e.g., the first bond pad and a portion of the conductive element).

In some embodiments, the underfill layer may include a plurality of filler particles. The filler particles may be disposed throughout the underfill layer in a generally random distribution pattern. For example, the filler particles may have varying diameters within a predetermined range of diameters, and the positions of the filler particles within the underfill layer may be substantially independent of filler particle size/diameter. In some embodiments, at least some of the filler particles may be in contact with the one or more interconnect structures or some portion thereof (e.g., in contact with the first bond pad). In other embodiments, at least some of the filler particles may be disposed at an interface between the underfill layer and the first or second IC substrate.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In prior IC package assemblies that include an underfill layer, the settling of filler particles within the encapsulant (e.g., a resin) results in a size-dependent distribution of the filler particles and/or an encapsulant-rich area within the underfill layer. The encapsulant-rich area is typically the portion of the underfill layer that is proximal to the bumps/bond pads of the die. This area may have lower stress resistance and/or a higher CTE than the rest of the underfill layer.

In contrast, methods and apparatuses in accordance with embodiments of the present disclosure provide a generally random distribution pattern of filler particles within an underfill layer. In some embodiments, a generally random distribution pattern of filler particles may be obtained by one or more of reducing an electrostatic charge on the underfill material, the IC package assembly, or portion(s) thereof, applying an electric force against the filler particles of the underfill material in a direction opposite to a direction of gravitational force, using an underfill material with a relatively low maximum filler particle size, and/or snap curing the underfill layer at a relatively low temperature (e.g., 120-130° C.).

As used herein, the term "generally random distribution pattern" may be used in reference to a distribution pattern of filler particles within an underfill layer, in which the filler particles have a range of diameters and the relative positions of the filler particles are substantially independent of filler particle diameter. The underfill layer may have first and second halves defined by an imaginary plane extending through the underfill layer equidistant between a first surface of the underfill layer (e.g., the surface nearest to the first IC substrate) and an opposite second surface of the underfill layer. In one example, where the filler particles within the underfill layer have a given range of diameters (e.g., range of 0.01-25 µm, 0.01-5 µm, 0.01-3 µm, 10-500 nm, or 10-5000 nm), the filler particles are in a "generally random distribution pattern" if at least 20-30% of the filler particles are disposed within the first half of the underfill layer, at least another 20-30% of the filler particles are disposed within the second half of the underfill layer, and at least some of the filler particles are disposed at the first and second surfaces or in contact with the interconnect structure(s) or portion(s) thereof.

Figure 1:
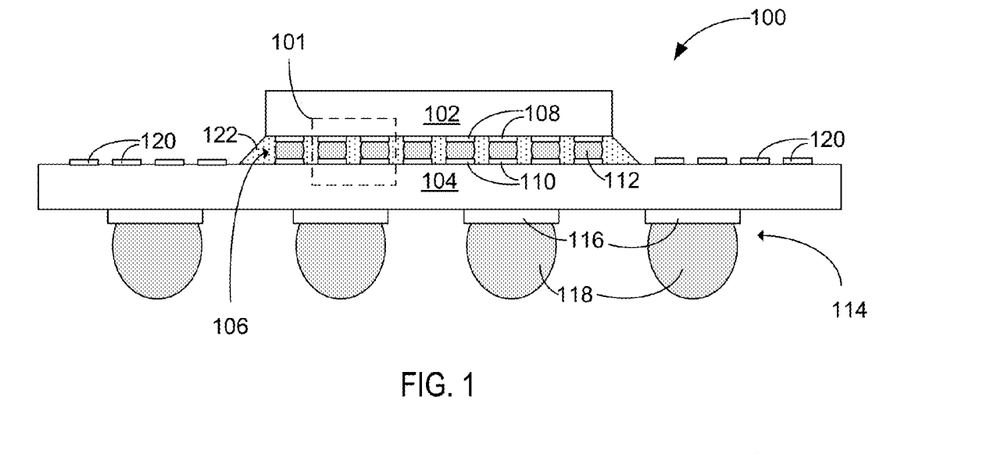
FIG. 1 schematically illustrates a cross-section view of an example integrated circuit (IC) package assembly, in accordance with some embodiments.

FIG. 1 schematically illustrates an example integrated circuit (IC) package assembly 100, in accordance with some embodiments. The IC package assembly 100 may include one or more dies (hereinafter "die 102") coupled with a package substrate 104 using one or more die interconnect structures (hereinafter "interconnect structures 106"). In some embodiments, an interconnect structure 106 may include one or more bond pads connected by solderable material or other electrically conductive material. In the illustrated example, interconnect structures 106 include a first bond pad 108, solderable material 112, and a second bond pad 110.

In some embodiments, the die 102 may be coupled with the package substrate 104 in a flip-chip configuration. In a flip-chip configuration, an active side of the die 102 may be directly coupled with the package substrate 104 using the interconnect structures 106. For example, bond pads 108 on the active side of the die 102 may be coupled with corresponding bond pads 110 on the package substrate 104 using solderable material 112 (e.g., solder bumps) to form an electrically conductive bond between the die 102 and the package substrate 104. In some embodiments, the interconnect structures 106 may be configured to route electrical signals such as, for example, input/output (I/O) signals and/or power to or from the die 102. The solderable material 112 may be configured in an array of bumps in some embodiments.

The package substrate 104 may be configured to electrically couple with another external component (e.g., a circuit board such as motherboard 802 of FIG. 7) using one or more package interconnect structures 114. The interconnect structures 114 may include, for example, bond pads 116 and solder balls 118 configured to route the electrical signals (e.g., I/O and/or power) to or from the package substrate 104. The interconnect structures 114 may be arranged in a ball-grid array (BGA) configuration in some embodiments.

The package substrate 104 may be further configured to electrically couple with another external component (e.g., other dies or substrates) using bond pads 120. The bond pads 120 may be configured to route the electrical signals to or from the package substrate 104. The package substrate 104 may include features such as, for example, traces (not shown) or other form of wiring to route the electrical signals of the die 102 to bond pads 116, 120. In some embodiments, the package substrate 104 may be an interposer.

The interconnect structures 106, 114 and bond pads 120 may be composed of any of a wide variety of electrically conductive materials including metals such as, for example, gold, copper, aluminum, silver, tin, palladium, or nickel. The interconnect structures 106, 114 and bond pads 120 may include other suitable structures or configurations than depicted in other embodiments such as, for example, posts or other well-known structures or configurations.

In various embodiments, the die 102 and the package substrate 104 may each be referred to as an "IC substrate." The die 102 may include a substrate composed of a semiconductor material upon which electrical devices such as, for example, transistors and associated circuitry are formed. The package substrate 104 may include a laminate substrate composed of a polymer such as epoxy upon which traces or other circuitry may be formed. The die 102 and the package substrate 104 are not limited to these example materials and may include other suitable well-known materials in other embodiments. Principles described herein are not limited to these examples and may be applied to other types of substrates (e.g., a circuit board) in other embodiments.

In some embodiments, an underfill layer 122 may be disposed between the die 102 and the package substrate 104. The underfill layer 122 may substantially fill a gap between the die 102 and the package substrate 104 and gaps between the interconnect structures 106, as can be seen. The underfill layer 122 may provide package stability and reliability of the IC package assembly 100 by reducing a Coefficient of Thermal Expansion (CTE) mismatch between the die 102 and the package substrate 104 and/or interconnect structures 106, and structurally strengthen the IC package assembly 100 by providing adhesive or other structural support. In some embodiments, the underfill layer 122 may include filler particles 124 and a polymer such as, for example, an acrylic-based or epoxy-based material such as resin materials (see e.g., FIGS. 2a and 2b).

Figure 2A:
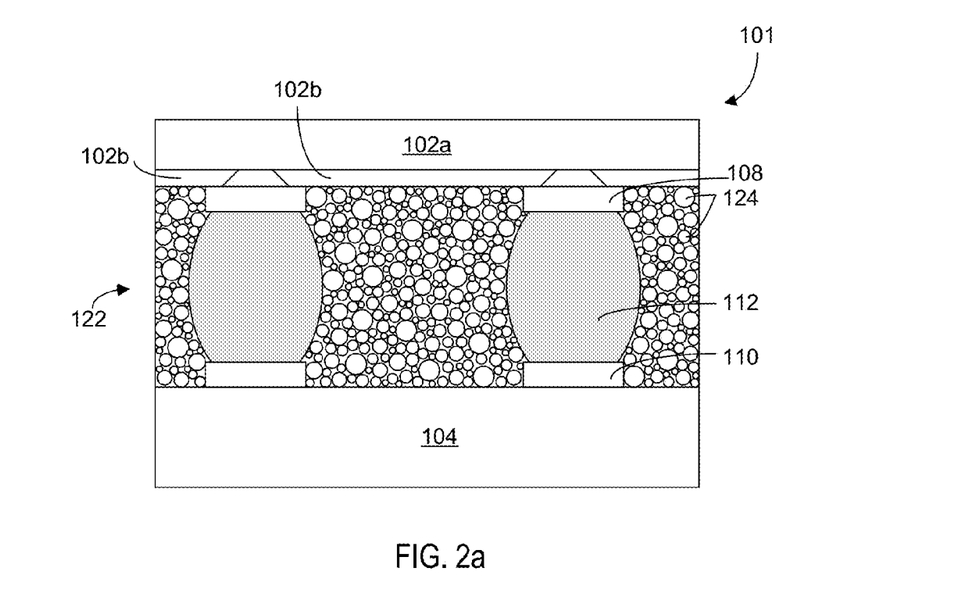
FIGS. 2*a* and 2*b* schematically illustrate enlarged views of a portion of the example IC package assembly of FIG. 1, in accordance with some embodiments.
Figure 2B:
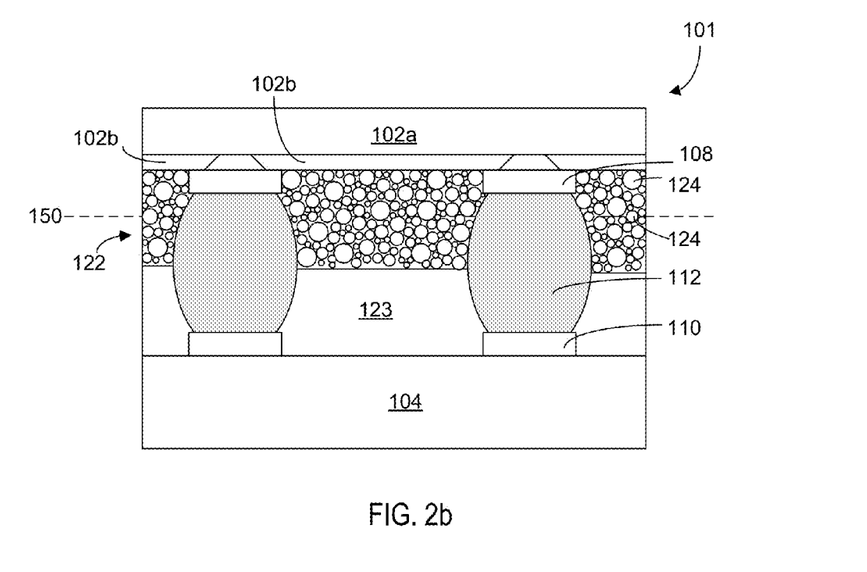

FIGS. 2a and 2b schematically illustrate enlarged views of a portion (indicated as "101") of the example IC package assembly of FIG. 1, in accordance with some embodiments. As illustrated, the die 102 may include a passivation layer 102b coupled to the active side of the die portion 102a. The passivation layer 102b may include a photosensitive material in some embodiments. In some embodiments, the underfill layer 122 may substantially fill a space between the die 102 and the IC substrate 104 (FIG. 2a). In other embodiments, a solder resist layer 123 may be coupled to the IC substrate 104, and the underfill layer 122 may substantially fill a space between the solder resist layer 123 and the die 102. In some embodiments, a first surface of the underfill layer 122 may be in contact with the die 102 (e.g., with passivation layer 102b and/or die portion 102a). A second opposite surface of the underfill layer 122 may be in contact with the IC substrate 104 and/or with solder resist layer 123. The composition of solder resist layer 123 may vary among embodiments, and may include (but is not limited to) an epoxy, a photoimageable film/ink, or any suitable polymer (e.g., a thermoset).

The filler particles 124 of underfill layer 122 may be of various sizes/diameters. In some embodiments, the filler particles 124 may have diameters within a given range, such as 0.01 µm to 25 µm, 0.01 µm to 10 µm, 0.01 µm to 5 µm, 0.01 µm to 3 µm, 0.05 µm to 25 µm, 0.05 µm to 10 µm, 0.05 µm to 5 µm, 0.05 µm to 3 µm, 0.1 µm to 25 µm, 0.1 µm to 10 µm, 0.1 µm to 5 µm, or 0.1 µm to 3 µm. In other embodiments, the largest filler particles 124 may be less than 3 µm in diameter. Filler particles 124 may be particles of silica (SiO2) or other known filler materials (e.g., aluminum oxide).

As best viewed in FIG. 2b, the underfill layer 122 may have first and second halves defined by an imaginary plane 150 that extends equidistant between a first surface of the underfill layer 122 (e.g., the surface nearest to the die 102) and an opposite second surface of the underfill layer 122 (e.g., the surface nearest to solder resist layer 123). In some embodiments, at least 20-30% of the filler particles 124 may be disposed within the first half of the underfill layer, at least another 20-30% of the filler particles 124 may be disposed within the second half of the underfill layer, and at least some of the filler particles 124 may be disposed at the first and second surfaces or in contact with the interconnect structure(s) or portion(s) thereof. Each of the first and second halves of the underfill layer 122 may include filler particles 124 with diameters near the upper end of the given range of diameters and other filler particles 124 with diameters near the lower end of the given range of diameters. For example, the given range of diameters may be 0.05 µm to 5 µm, and each of the first and second halves of the underfill layer 122 may include some filler particles 124 that are 5 µm in diameter and others that are 0.05 µm in diameter.

The underfill layer 122 may be formed by dispensing underfill material by known methods (e.g., by a pump-driven needle or jet dispense process) and curing the underfill material in one or more stages at predetermined temperature(s) and duration(s) of time. In accordance with embodiments described further below, a generally random distribution pattern of filler particles 124 within the underfill layer 122 may be produced by reducing an electrostatic charge on one or more of the underfill material and the interconnect structure(s) 106, applying an electric field to the IC package assembly during the dispense/cure, snap-curing the underfill material at a relatively low temperature (e.g., 120-130° C.), and/or using an underfill material with filler particles a relatively low maximum filler particle diameter (e.g., up to 3 µm or up to 5 µm in diameter). In various embodiments, any one or more of these techniques may be used alone or in combination. Examples of corresponding configurations and methods are illustrated in FIGS. 3-6 and 7-9.

Figure 6:
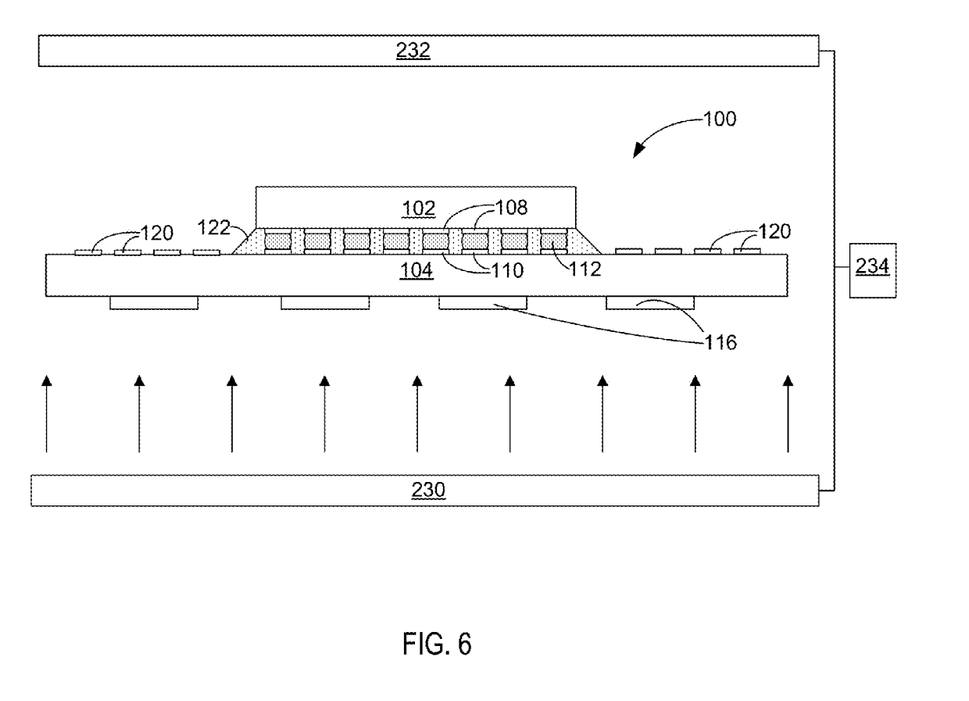
FIG. 6 schematically illustrates an example cross-section view of an electrical field applied to an integrated circuit (IC) package assembly, in accordance with some embodiments.
Figure 7:
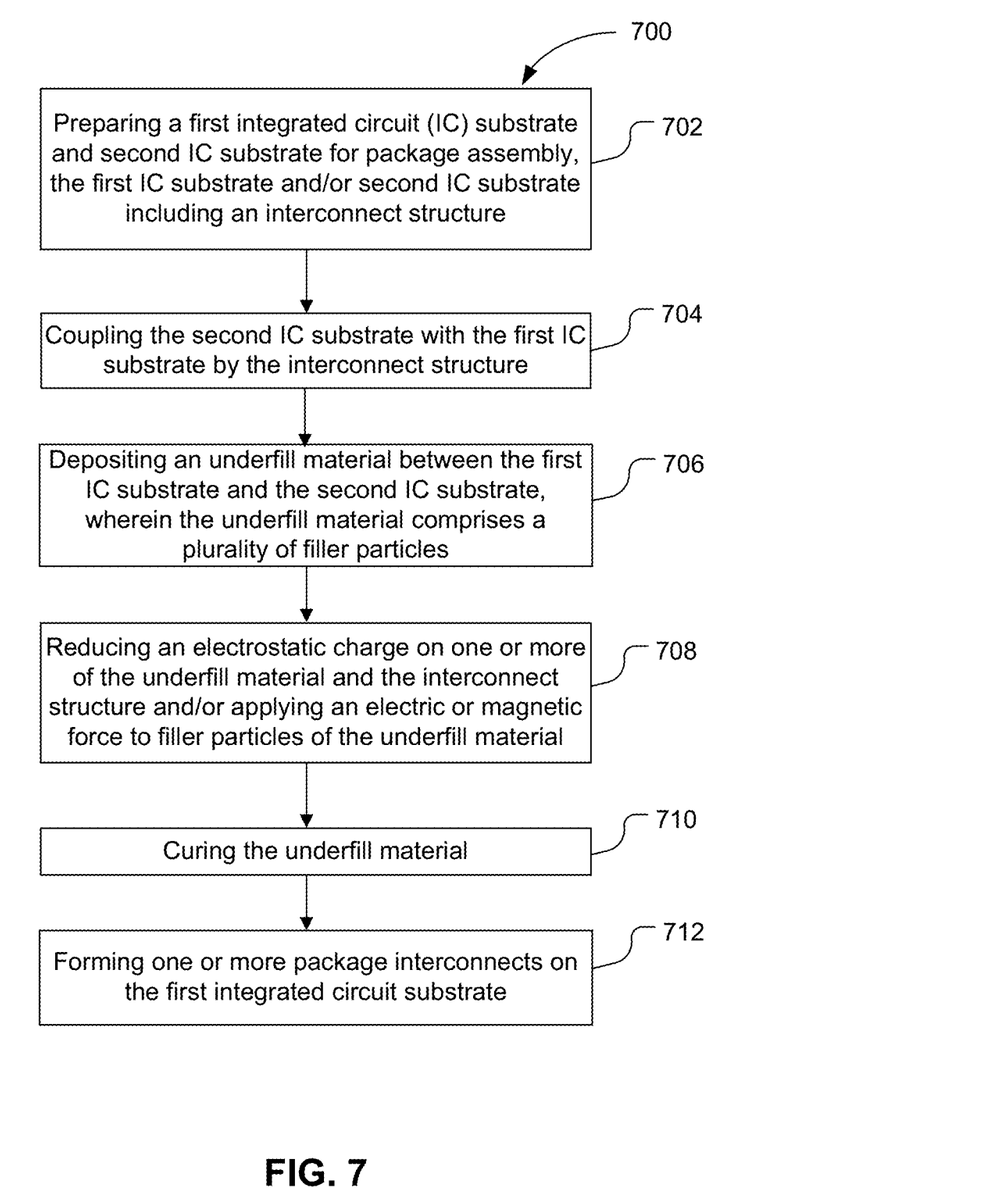
FIG. 7 is a flow diagram for a method of fabricating an IC package assembly, in accordance with some embodiments.

FIG. 7 is a flow diagram for a method 700 of fabricating an IC package assembly, in accordance with some embodiments. The method of FIG. 7 may comport with embodiments described with reference to FIGS. 1-2b and to FIGS. 3-6, which illustrate corresponding aspects of method 700. Referring first to FIG. 7, at 702, the method 700 may include preparing a first integrated circuit (IC) substrate (e.g., package substrate 104 of FIG. 1) and second IC substrate (e.g., die 102 of FIG. 1) for package assembly, the first IC substrate and/or second IC substrate including a plurality of interconnect structures (e.g., interconnect structures 106, 114 or bond pads 120 of FIG. 1). Preparation may include forming the plurality of interconnect structures on the first IC substrate and/or second IC substrate. For example, the IC substrate may be a package substrate and the second IC substrate may be a die. The die may be prepared for package assembly by singulation processes (e.g., die-cutting by saw or laser) to provide a discrete die from a wafer having multiple dies, thinning of the die, and/or coating of the die to protect the die from equipment handling associated with package assembly.

At 704, the method 700 may further include coupling the second IC substrate with the first IC substrate using one or more of the plurality of interconnect structures. In some embodiments, solder joints are formed between the first IC substrate and the second IC substrate by reflowing solderable material (e.g., solderable material 112 of FIG. 1) disposed on bond pads (e.g., bond pads 108, 110 of FIG. 1). A solder reflow process may be a thermal process using temperatures greater than 200° C. (e.g., 340° C. to 360° C.) to soften the solderable material for bonding.

At 706, the method 800 may further include depositing an underfill material between the first IC substrate and the second IC substrate. The underfill material may be deposited by a needle dispense or jet dispense process. Capillary action of the underfill material may cause the underfill material to spread between the first IC substrate and second IC substrate.

In some embodiments, the underfill material may include filler particles (e.g., filler particles 124) having diameters within a given range of diameters. In other embodiments, the given range may have an upper limit of 25 µm. In still other embodiments, the given range may have an upper limit of 5

μm. In still other embodiments, the given range may have an upper limit of 3 μm or less. The filler particles may be filtered through a mesh or processed by other methods to exclude larger filler particles (e.g., filler particles with diameters that exceed the upper limit) from the underfill material. This may reduce gravity-driven settling of filler particles during the dispensing/curing of the underfill material.

At 708, the method 700 may include reducing an electrostatic charge on one or more of the underfill material and the interconnect structure(s) and/or applying an electric force to filler particles of the underfill material. Reducing the electrostatic charge may reduce or eliminate electrostatic repulsion between the underfill material and the interconnect structure(s). Alone or in combination with other techniques, the reduction of electrostatic charge may allow the filler particles to be randomly dispersed throughout the underfill layer. In various embodiments, reducing the electrostatic charge may include one or more of grounding the IC package assembly and/or interconnect structure(s), grounding the underfill material, and/or applying a functional group to one or more of the interconnect structure(s).

Figure 3:
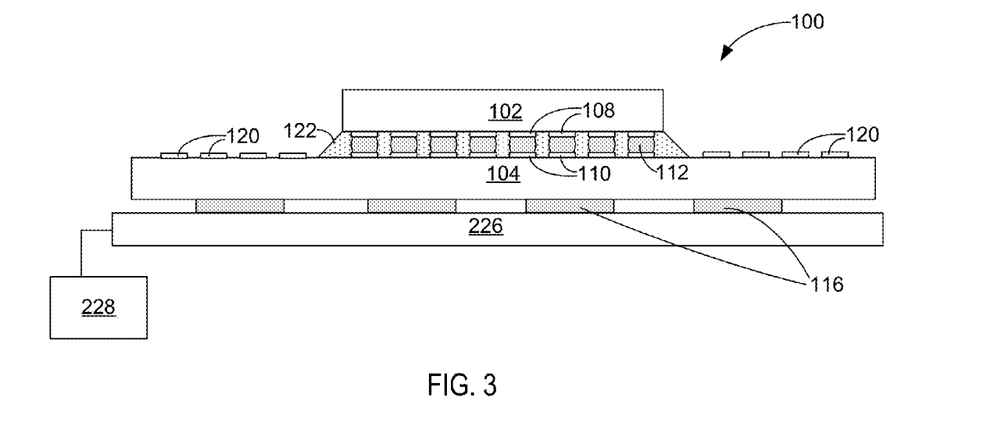
FIG. 3 schematically illustrates an example cross-section side view of an electrically grounded integrated circuit (IC) package assembly, in accordance with some embodiments.

In one embodiment, reducing the electrostatic charge includes grounding the IC package assembly. FIG. 3 schematically illustrates an example cross-section side view of an electrically grounded integrated circuit (IC) package assembly, in accordance with some embodiments. As illustrated, an IC package assembly 100 may be grounded to a conductive portion of the IC package assembly (e.g., die 102, interconnect structure 106, bond pad 108, solderable material 112). In some embodiments, IC package assembly 100 may be in contact with an electrically conductive element 226. Electrically conductive element 226 may be configured to absorb an electrostatic charge from a component of the IC package. For example, IC package assembly 100 may be placed onto the electrically conductive element 226 such that the electrically conductive element 226 is electrically coupled with one or more interconnect structures or portions thereof (e.g., interconnect structures 106, bond pads 108, solderable material 112). Electrostatic charge may flow from interconnect structures 106 or portion(s) thereof to the electrically conductive element 226, resulting in the reduction or elimination of an electrostatic charge on the interconnect structures 106 and/or IC package assembly 100.

Figure 4A:
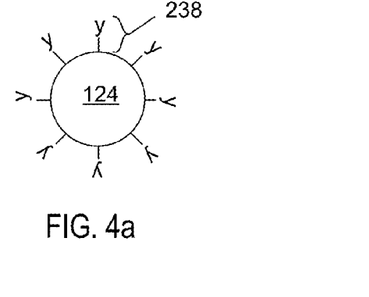
FIG. 4*a* schematically illustrates an example of a surface treatment applied to an underfill particle prior to deposition of an underfill material between IC substrates, in accordance with some embodiments.

In another embodiment, reducing the electrostatic charge includes applying a surface treatment to the filler particles prior to mixing the filler particles with other components of the underfill material (e.g., epoxy or resin). The surface treatment may include one or more functional groups. FIG. 4a schematically illustrates an example of functional groups 238 coupled to the surface of a filler particle 124. Functional groups 238 may be selected based on inherent zeta potential and/or on characteristics of other underfill material components (e.g., resin, epoxy, cross-linking agent/hardener). Coupling functional groups 238 to the surface of filler particle 124 may reduce a static charge on the filler particle 124. For example, the static charge may be reduced from a range of about −18 to −15 kV to a range of about −10 to −7 kV. In some embodiments, functional groups 238 may have polarization —OH or epoxy type bonds, which have a lesser Zeta potential than aromatic functional groups. Examples of suitable functional groups 238 may be, for example, hydroxyl groups, silane based functional groups or some ionic functional groups.

Figure 4B:
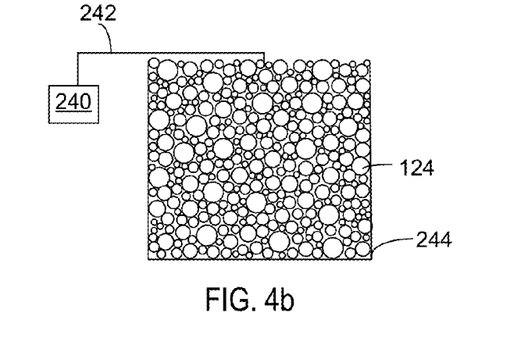
FIG. 4*b* schematically illustrates an example view of an electrically grounded underfill material prior to deposition of the underfill material between IC substrates, in accordance with some embodiments.

In another embodiment, reducing the electrostatic charge includes grounding the underfill material. FIG. 4b schematically illustrates an example view of an electrically grounded underfill material prior to deposition of the underfill material between IC substrates, in accordance with some embodiments. As illustrated, underfill material including filler particles 124 may be contained in a vessel 244. As illustrated, an IC package assembly 100 may be grounded by coupling an electrically conductive element 242 (e.g., a plate or wire) to the underfill material and/or vessel 244. In some embodiments, the electrically conductive element 242 may be further coupled to a ground 240. Electrically conductive element 242 and/or ground 240 may be configured to absorb an electrostatic charge from a component of the IC package, resulting in the reduction or elimination of an electrostatic charge on the underfill material. In other embodiments, the underfill material may be grounded during the dispensing/curing of the underfill material.

Figure 5:
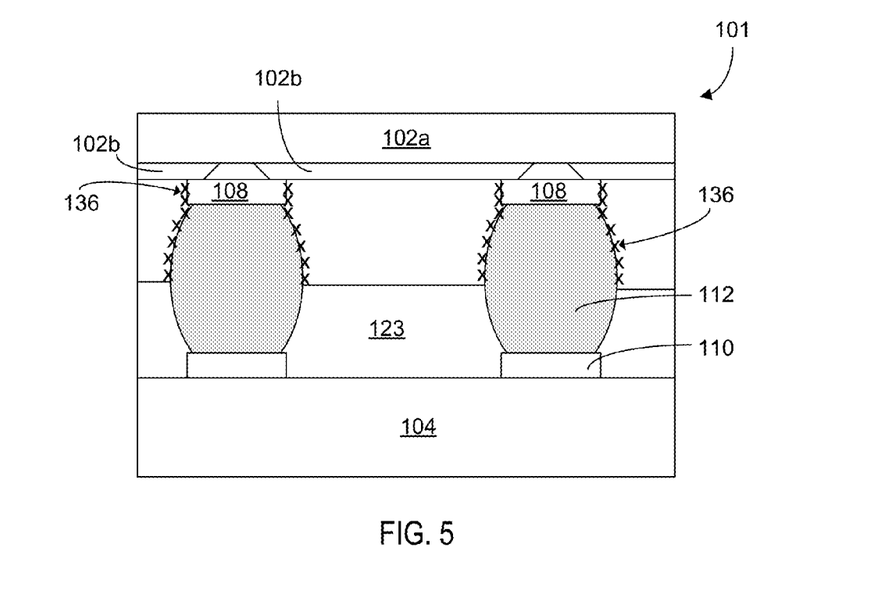
FIG. 5 schematically illustrates an example cross-section view of an electrically neutral treatment applied to interconnect structures of an IC package assembly prior to addition of an underfill material, in accordance with some embodiments.

In another embodiment, reducing the electrostatic charge includes applying a functional group to one or more of the interconnect structure(s). FIG. 5 schematically illustrates an example schematic cross-section view of electrically neutral functional groups applied to interconnect structures of an IC package assembly prior to addition of an underfill material, in accordance with some embodiments. In some embodiments, the functional groups may be applied to portions of an interconnect structure, such as bond pads and/or solderable material. For example, functional groups 136 may be coupled to bond pads 108 and to a portion of the solderable material 112 prior to dispensing the underflow material. The functional groups 136 may reduce or eliminate a galvanic cell charge and/or a charge field around interconnect structures 106. This may reduce charge repulsion between the interconnect structures and the underfill material. Functional groups 136 may be or include any organic functional groups. In one embodiment, functional groups 136 are silicon nitrate (SiN). These functional groups can be attached to interconnect structures by surface treatment.

In another embodiment, 708 may include applying an electric force to the filler particles of the underfill material. The filler particles 124 may have an electrostatic charge, allowing the filler particles to be manipulated by the application of electric force. Therefore, an electric force may be applied to the filler particles to counteract gravitational force, thereby reducing gravity-driven filler particle settling. Alternatively, the filler particles can be tailored to provide a different property (e.g., one or more magnetic properties), and a different stimulus (e.g., a magnetic field) can be used to manipulate the particles.

In some embodiments, applying an electric force to the filler particles may include biasing the interconnect elements (e.g., interconnect elements 106) by coupling the IC package assembly 100 to a current/voltage source 228 via an electrically conductive element 226 (e.g., a conductive surface/mat; see e.g., FIG. 3). The current/voltage source 228 may be operated to bias the IC package assembly. For example, the filler particles may be negatively charged, and a negative bias (e.g., −5 to −10V) may be applied while the underfill material is dispensed and/or cured. In other examples, the filler particles may be positively charged, and a positive bias may be applied while the underfill material is dispensed and/or cured. The magnitude of the bias to be applied to the electrically conductive element 226 may be determined based on, and may vary in accordance with, the mass and charge of the filler particles.

In other embodiments, applying an electric or magnetic force to the filler particles may include placing the IC package assembly in an electric or magnetic field. FIG. 6 schematically illustrates an example cross-section view of an electrical field applied to an integrated circuit (IC)

package assembly, in accordance with some embodiments. In the illustrated example, a first conductive apparatus 232 is positioned proximal to the die 102, and a second conductive apparatus is positioned proximal to the integrated circuit substrate 104. The first and second conductive apparatuses 232/230 are electrically coupled to a current source 234. Current source 234 may be operated to create a potential difference between the first and second conductive apparatuses 232/230.

In some embodiments, current source 234 may be a variable DC source. In other embodiments, the first and second conductive apparatuses 232/230 may be biased electrical plates. The current source 234 and first and second conductive apparatuses 232/230 may be used to generate a local electric field while the underfill material is being dispensed and/or cured. The potential required to overcome gravitational force may be determined based on the mass and charge of the filler particles 124 and the distance between the first and second conductive apparatuses 232/230. In one example, the potential difference between the first and second conductive apparatuses 232/230 is about 60 volts. In some embodiments, the filler particles 124 may be positively charged, and the first conductive apparatus 232 may be negatively biased. The electric field may exert force against the filler particles 124 in a first direction (see Arrows) that is opposite to a direction of gravitational force. This opposing force may reduce or eliminate gravity-driven settling of the filler particles 124. In other embodiments, the filler particles 124 may be negatively charged, and the second conductive apparatus 230 may be negatively biased.

At 710, the method 700 may include curing the underfill material. In some embodiments, the underfill material may be cured at a first temperature of 120-130° C. While conventional cure temperatures for underfill materials are typically in the range of 150-170° C., curing the underfill material at a lower temperature may reduce gravity-driven and/or charge-driven filler particle settling by increasing the viscosity of the underfill material and reducing filler particle mobility. In some embodiments, the underfill material may be cured at the first temperature for a predetermined length of time (e.g., for 15-45 minutes, 20-40 minutes, about 30 minutes).

In some embodiments, the underfill material may be subsequently cured at a second temperature higher than the first temperature. In some embodiments, the underfill material may be subsequently cured at a higher temperature (e.g., 160-180° C. or about 170° C.) for another predetermined length of time (e.g., for 1-2 hours or 1.5 hours). In other embodiments, the underfill material may be cured at gradually increasing temperatures. In still other embodiments, conventional curing methods/protocols may be used in place of actions described above with regard to 710.

At 712, the method 700 may further include forming one or more package interconnects on the first integrated circuit substrate. The package interconnects may include, for example, solder balls (e.g., solder balls 118 of FIG. 1) to facilitate coupling of the IC package assembly with another external component. The IC package assembly may be encapsulated with a mold compound and marked with laser markings to identify a product embodied in the IC package assembly in some embodiments.

In some embodiments, actions at 706, 708, 710, and/or 712 may be performed with the IC package assembly in an inverted position (i.e., flipped upside down such that the die 102 is below the integrated circuit substrate 104) during the action(s).

In some embodiments, actions at 706, 708, 710, and 712 are all performed. In other embodiments, actions at one or more of 706, 708, 710, and 712 may not be performed at all. Various operations are described as multiple discrete operations in turn, in a manner that is most helpful in understanding the claimed subject matter. However, the order of description should not be construed as to imply that these operations are necessarily order dependent. For example, in some embodiments, actions at 710 may be performed simultaneously with actions performed at 708. In other embodiments, actions at 708 may be performed any suitable time prior to depositing the underfill material at 706. Embodiments of method 700 may include some or all of the actions at 706, 708, 710, and 712 in any combination. For example, at 708 the filler particles can be surface-treated with functional groups to provide a tailored charge on the filler particles, and the filler particles can then be manipulated with DC or AC bias at 710.

While the above method is described with regard to construction of an IC package assembly, aspects of the method that are related to controlling filler movement can also be applied to other assembly processes to resolve other issues. Examples include, but are not limited to, resolving filler entrapment during logic/memory LMI attach, and controlled/variable CTE in epoxy materials that join two dissimilar CTE materials. Similarly, configurations and techniques provided herein may be applied to any other process or configuration in which epoxy material is used (e.g., in LMI joints where epoxy flux is used, or board level underfill).

Figure 8:
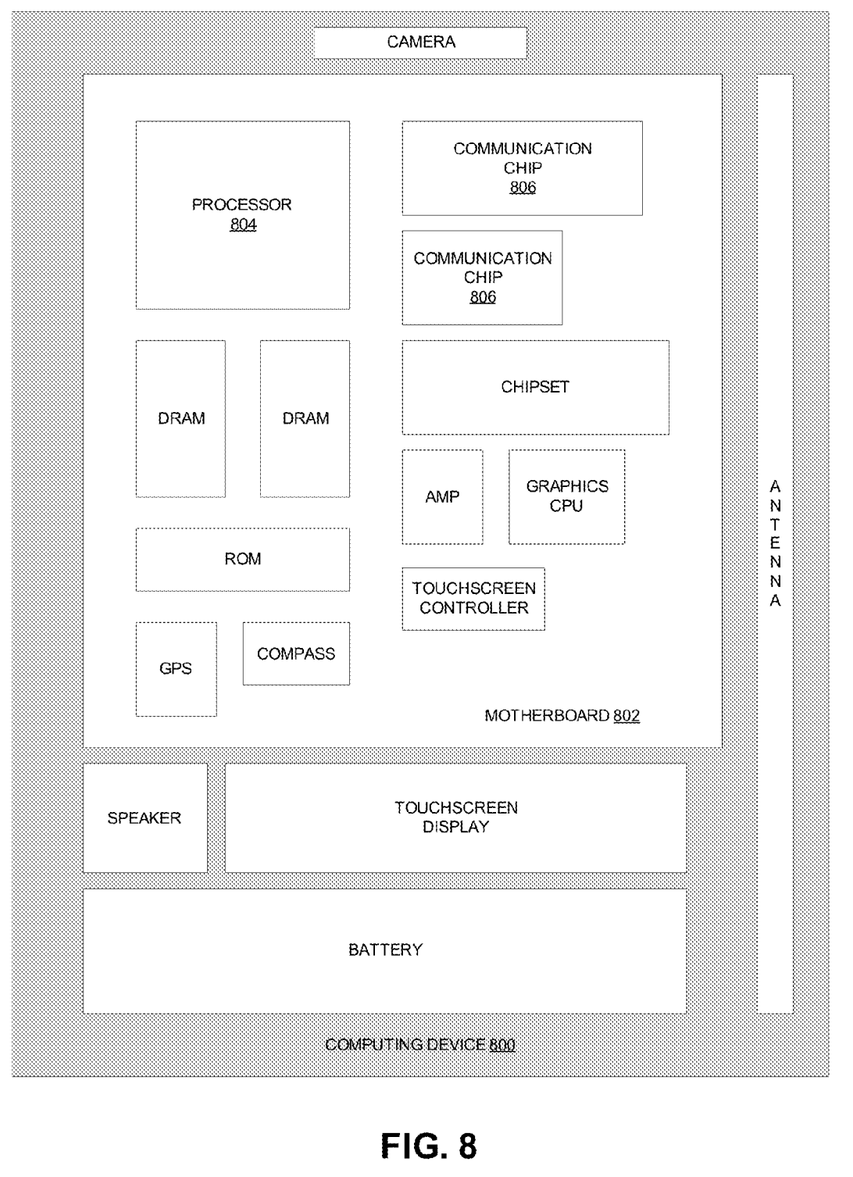
FIG. 8 schematically illustrates a computing device in accordance with one implementation of the invention.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired. FIG. 8 schematically illustrates a computing device 800 in accordance with one implementation of the invention. The computing device 800 may house a board such as motherboard 802. The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 may include a die (e.g., die 102 of FIG. 1) in an IC package assembly (e.g., IC package assembly 100 of FIG. 1) as described herein. The term "processor" may refer to any device or portion of a device that processes electronic data from registers and/or memory to transform that electronic data into other electronic data that may be stored in registers and/or memory.

The communication chip 806 may also include a die (e.g., die 102 of FIG. 1) in an IC package assembly (e.g., IC package assembly 100 of FIG. 1) as described herein. In further implementations, another component (e.g., memory device or other integrated circuit device) housed within the computing device 800 may contain a die (e.g., die 102 of FIG. 1) in an IC package assembly (e.g., IC package assembly 100 of FIG. 1) as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method comprising:
   providing a first integrated circuit, IC, substrate and a second IC substrate coupled by an interconnect structure;
   providing an underfill, UF, material comprising a combination of resin and filler particles;
   depositing the UF material between the first IC substrate and the second IC substrate;
   reducing settling of the filler particles by reducing an electrostatic charge of the filler particles within the deposited UF material; and
   curing the deposited UF material.

2. The method of claim 1, wherein reducing the electrostatic charge further comprises applying a surface treatment including one or more functional groups to the filler particles prior to combining the filler particles and the resin to create the UF material.

3. The method of claim 2, wherein applying the surface treatment reduces the electrostatic charge of the filler particles from a range of −18 kV to −15 kV to a range of −10 kV to −7 kV.

4. The method of claim 1, wherein reducing the electrostatic charge further comprises grounding the UF material subsequent to combining the filler particles with the resin of the underfill material.

5. The method of claim 4, wherein grounding the underfill material comprises:
   coupling an electrically conductive element to the UF material or a vessel holding the UF material; and
   coupling the electrically conductive element to ground.

6. The method of claim 1, wherein the filler particles are silica particles or aluminum oxide particles.

7. The method of claim 2, wherein a functional group includes a hydroxyl group, a silane based group, or an ionic functional group.

\* \* \* \* \*